United States Patent [19]

Sivan

[11] Patent Number: 5,006,911
[45] Date of Patent: Apr. 9, 1991

[54] TRANSISTOR DEVICE WITH HIGH DENSITY CONTACTS

[75] Inventor: Richard D. Sivan, Austin, Tex.

[73] Assignee: Motorola, Inc., Schaumburg, Ill.

[21] Appl. No.: 415,833

[22] Filed: Oct. 2, 1989

[51] Int. Cl.[5] .......................................... H01L 29/78
[52] U.S. Cl. ................................ 357/23.11; 357/23.1; 357/23.9; 357/23.14
[58] Field of Search ................. 357/23.11, 23.1, 23.14, 357/23.9

[56] References Cited

U.S. PATENT DOCUMENTS

| | | | |
|---|---|---|---|
| 4,095,251 | 6/1978 | Dennard et al. | 357/23.9 |
| 4,319,395 | 3/1982 | Lund et al. | 357/23.9 |
| 4,489,339 | 12/1984 | Uchida | 357/23.9 |
| 4,513,303 | 4/1985 | Abbas et al. | 357/23.9 |
| 4,737,828 | 4/1988 | Brown | 357/23.11 |
| 4,803,173 | 2/1989 | Sill et al. | 357/23.1 |
| 4,835,112 | 5/1989 | Pfiester et al. | 357/23.1 |
| 4,885,617 | 12/1989 | Mazure-Espejo et al. | 357/23.1 |
| 4,905,073 | 2/1990 | Chen et al. | 357/23.1 |
| 4,908,688 | 3/1990 | Lund et al. | 357/23.1 |
| 4,922,311 | 5/1990 | Lee et al. | 357/23.1 |

FOREIGN PATENT DOCUMENTS

| | | | |
|---|---|---|---|
| 0221431 | 5/1987 | European Pat. Off. | 357/23.1 |
| 3636249 | 5/1987 | Fed. Rep. of Germany | 357/23.1 |
| 55-67168 | 5/1980 | Japan | 357/23.1 |
| 58-87871 | 5/1983 | Japan | 357/23.1 |
| 61-19174 | 1/1986 | Japan | 357/23.14 |
| 64-762 | 1/1989 | Japan | 357/23.11 |

OTHER PUBLICATIONS

Conference: International Electron Devices Meeting (Technical digest), Washington, D.C., Dec. 6-8 1976, "MOSFETs With Polysilicon Gates Self-Aligned to the Field Isolation and to the Source/Drain Regions", by V. L. Rideout et al.

Primary Examiner—Rolf Hille
Assistant Examiner—Steven Loke
Attorney, Agent, or Firm—James L. Clingan, Jr.

[57] ABSTRACT

A transistor device has a gate centered in an active region in which the gate does not extend beyond the active region. The active region has stem portion for the gate and a branch portion extending from each side of the stem portion for the formation of contacts. Raised polysilicon contacts are formed in the branch portions simultaneously with the gate being formed by selective polysilicon deposition. A source and drain are formed on sides of the gates while simultaneously doping the raised polysilicon contacts and the gate. A conformal insulator is etched to form holes to the raised contacts and the gate. These holes, even if over source and drain, do not penetrate to the source or drain because of the raised nature of the polysilicon contacts. Thus, the holes are filled with conductive material to form contacts over source and/or drain which do not contact source/drain. Thus there is no short from gate to source/drain even though the contact to gate is made over the active region. The gate, then, does not need to extend beyond the active region to provide for a metal contact thereto.

9 Claims, 7 Drawing Sheets

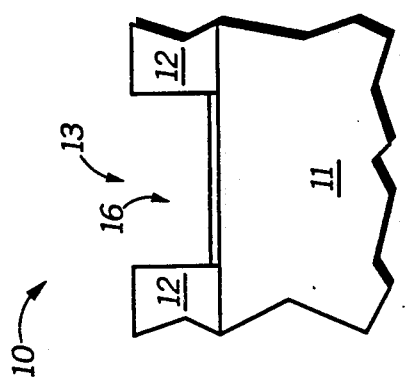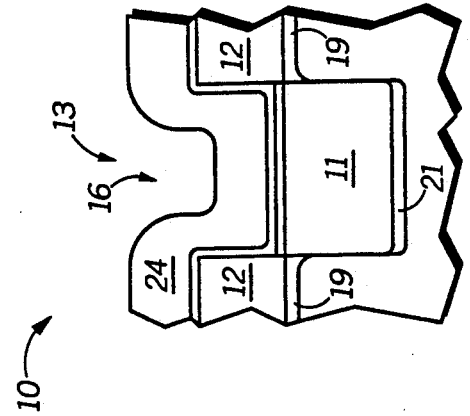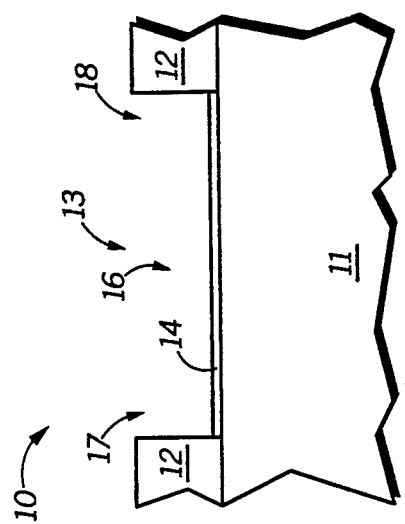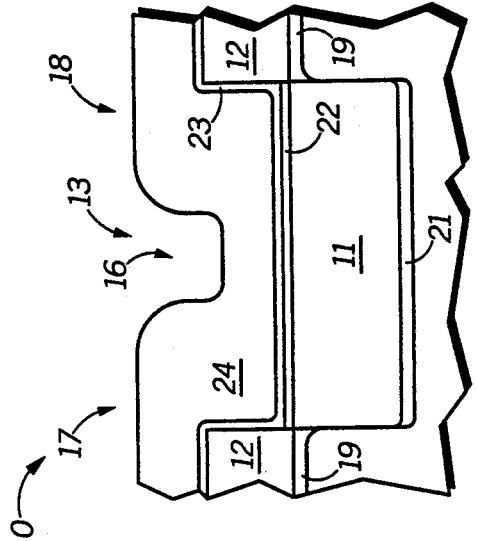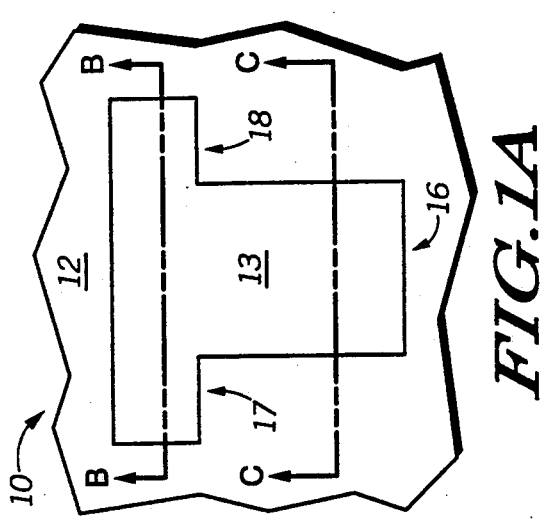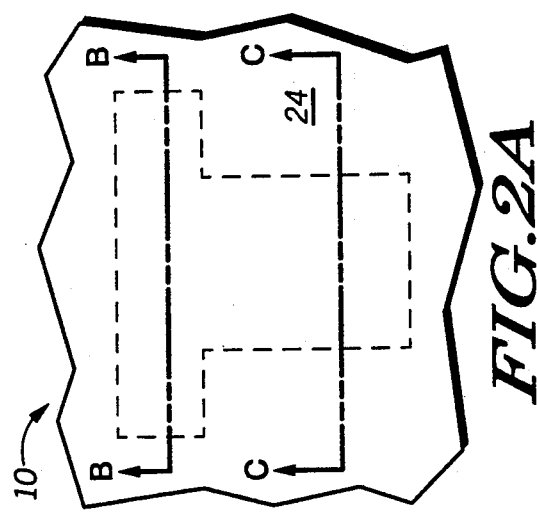

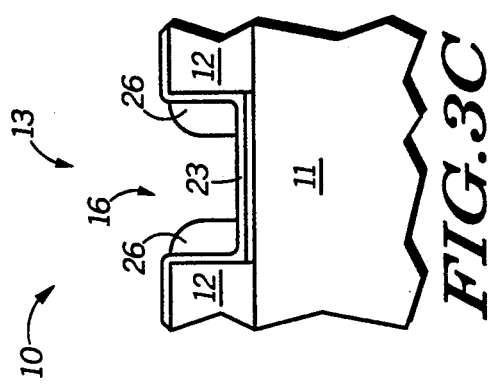
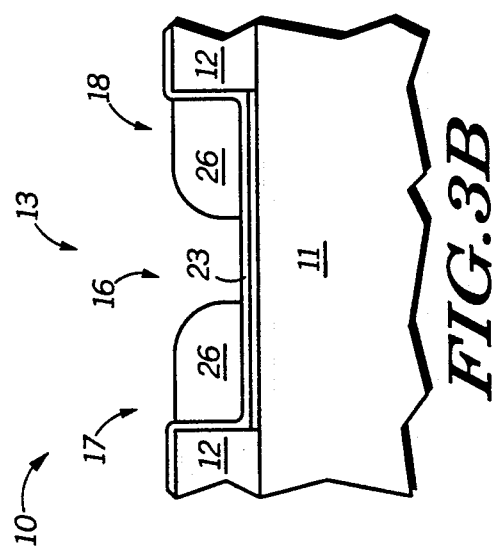
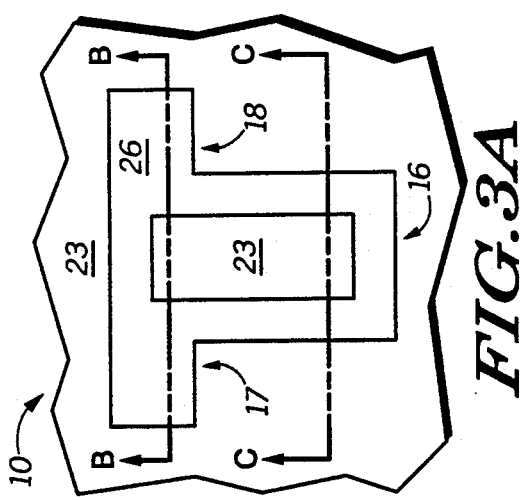
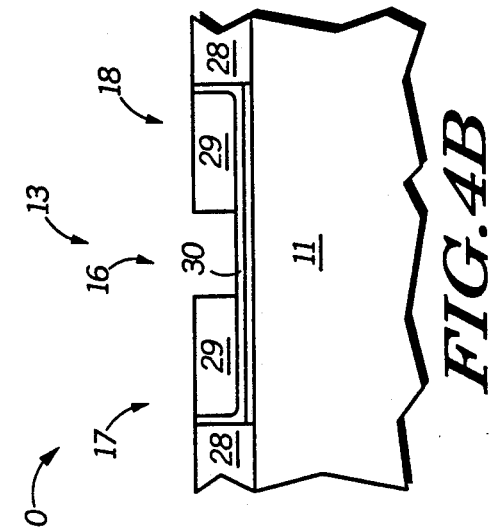
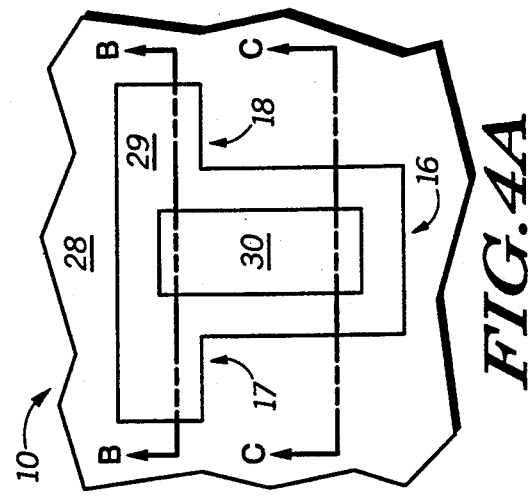

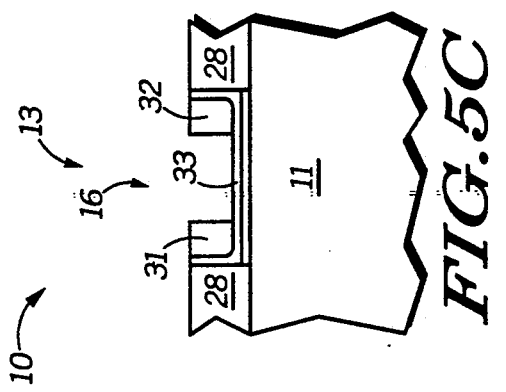
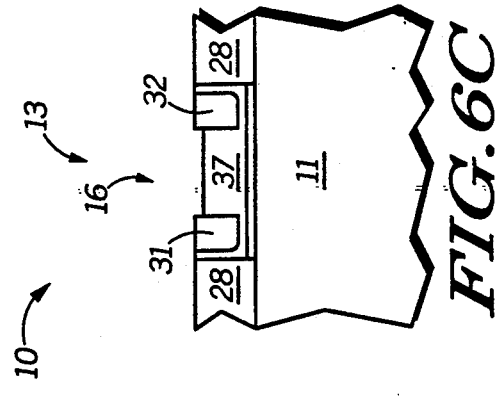
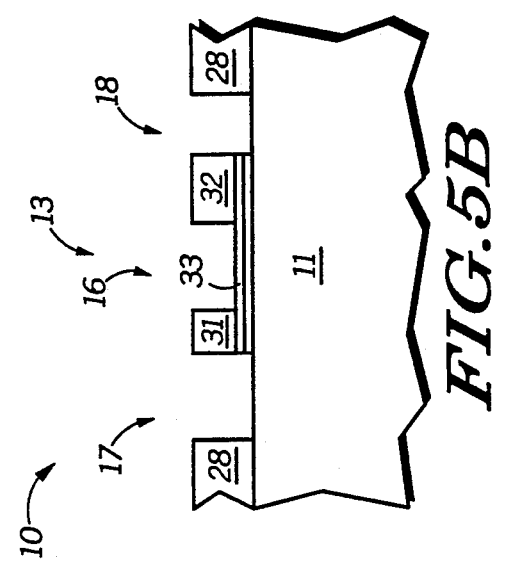
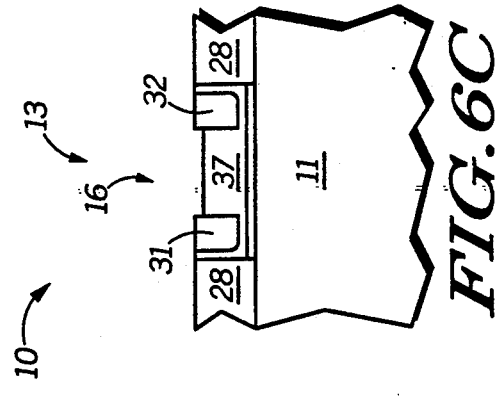
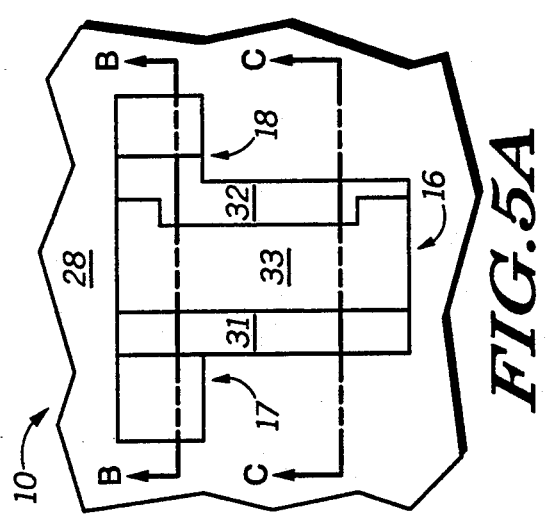
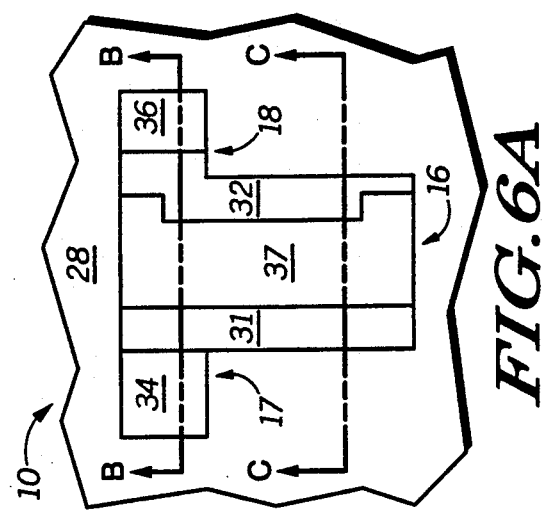

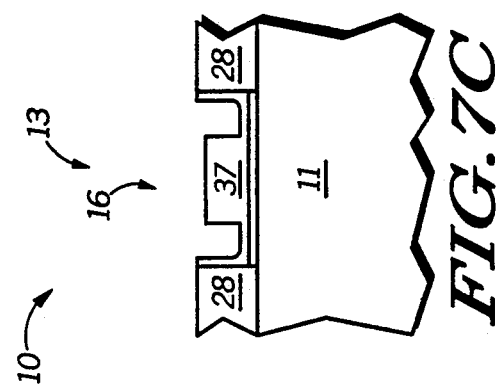
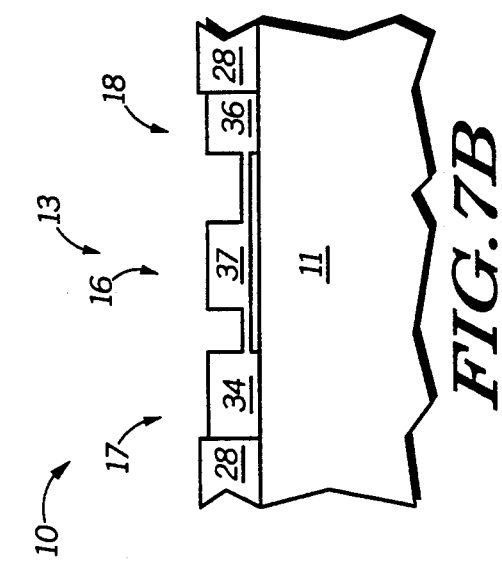
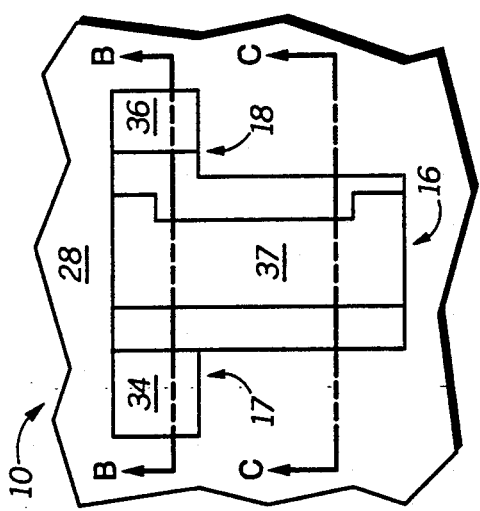
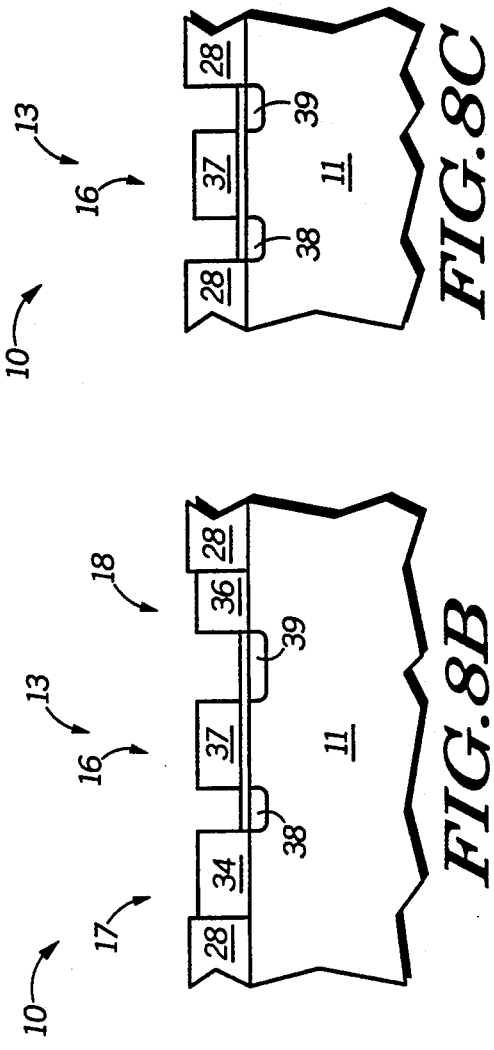
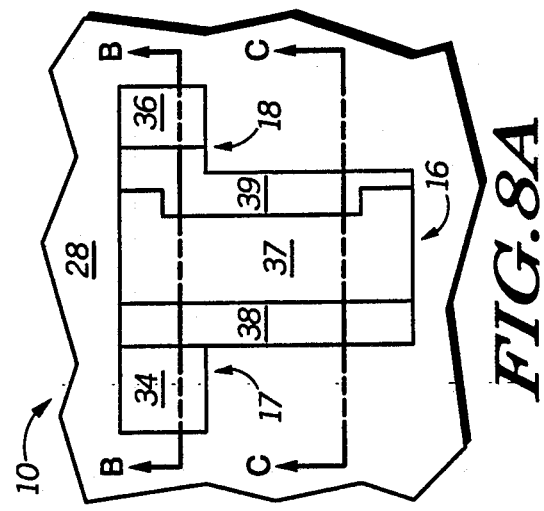

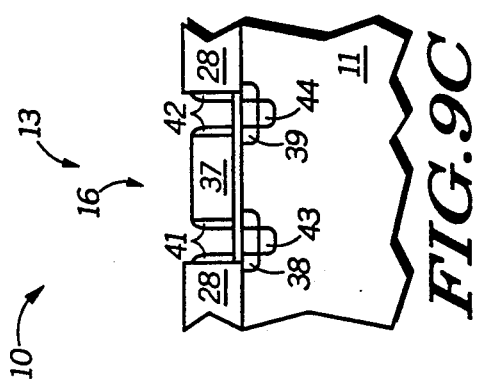
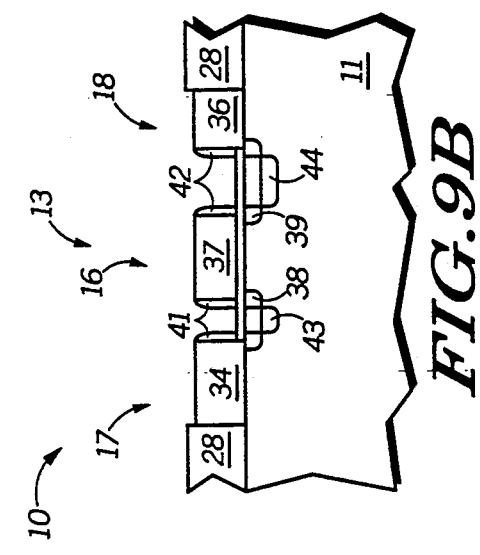
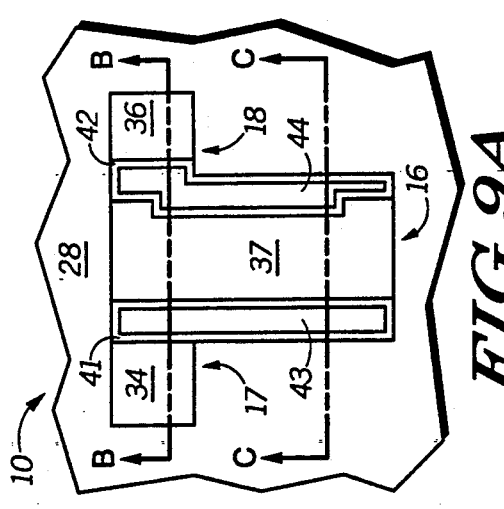
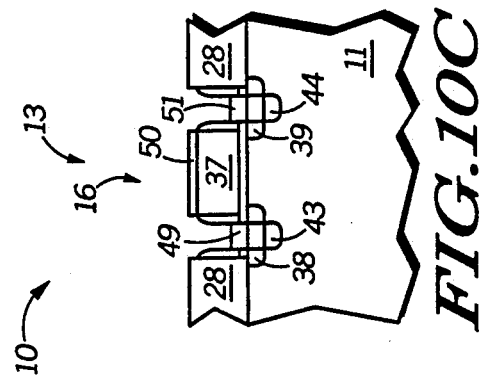
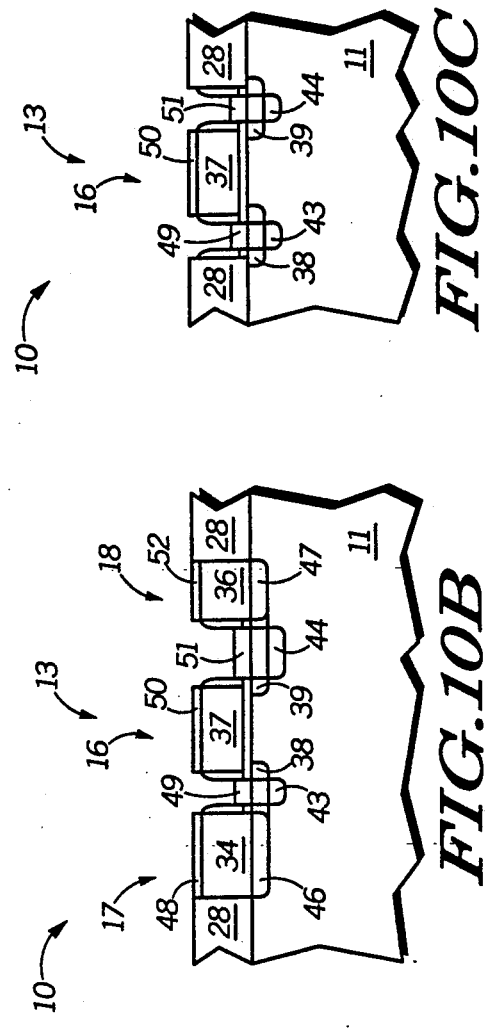
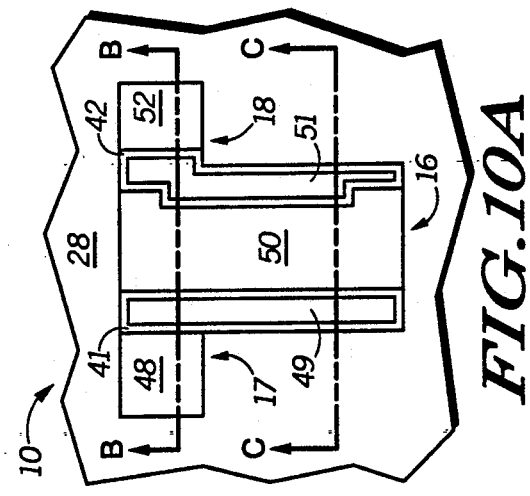

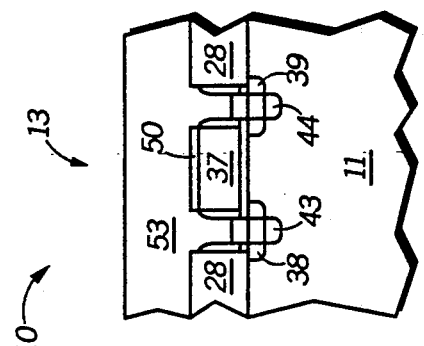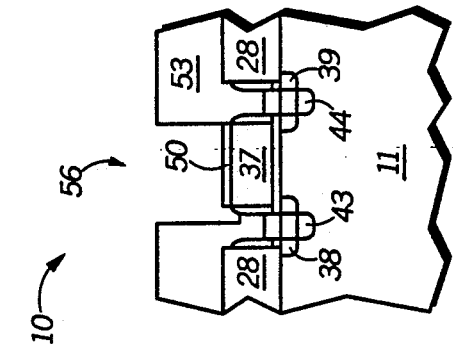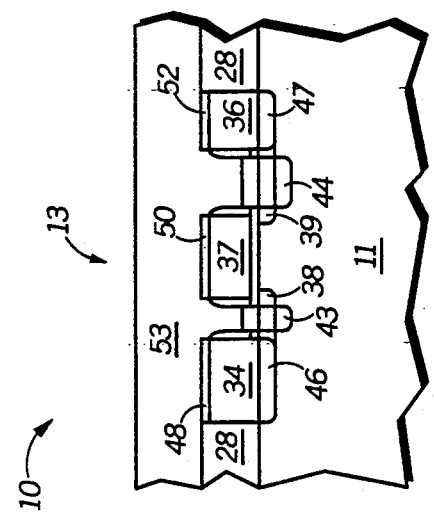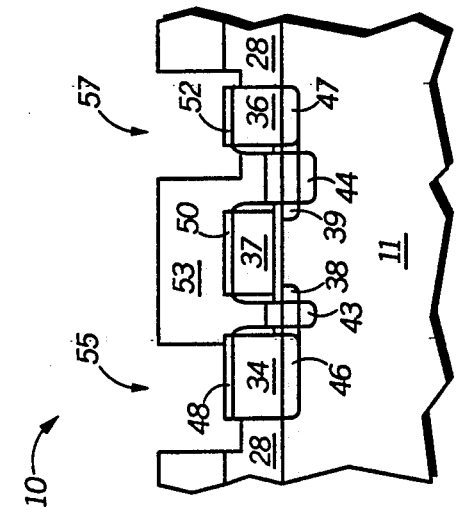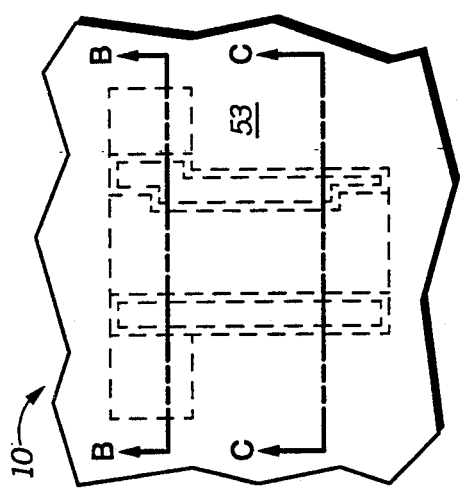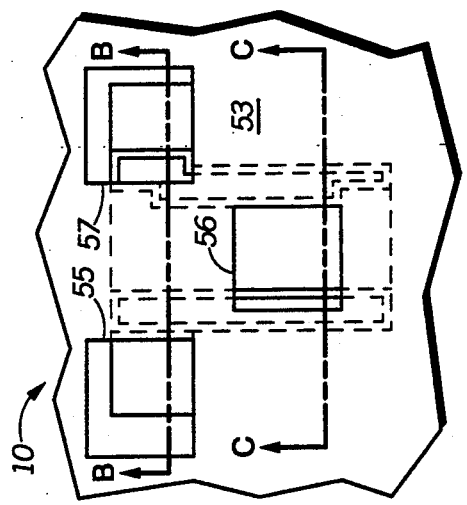

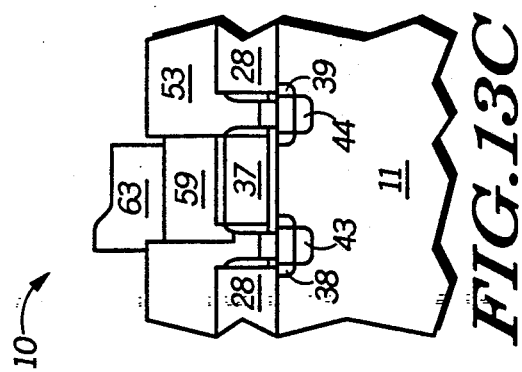
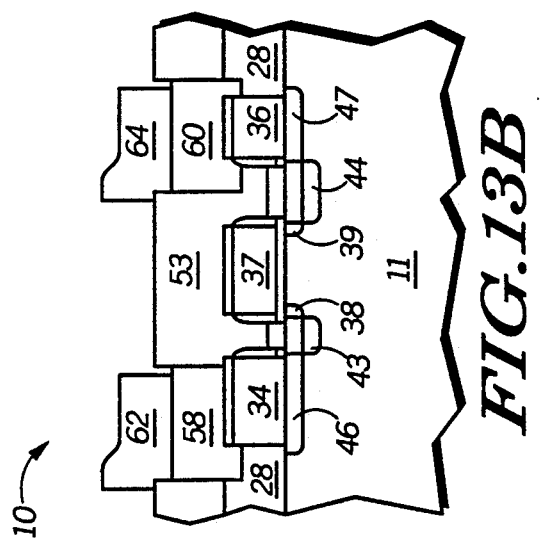
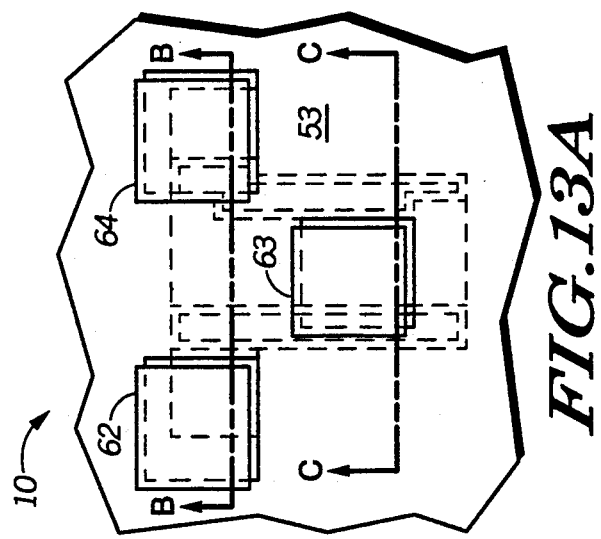

TRANSISTOR DEVICE WITH HIGH DENSITY CONTACTS

FIELD OF THE INVENTION

The invention relates semiconductor devices, and more particularly, to MOS semiconductor devices with high density contacts.

BACKGROUND OF THE INVENTION

One of the problems of semiconductor manufacturing is making contact to the various elemdents of an integrated circuit. It is desirable for the contact area to be as small as possible and still make effective electrical contact. In the case of a MOS transistor, the contact to the source/drain requires that the source and drain areas be made sufficiently large to accommodate the contact. The area is significantly larger than is otherwise required for source/drain functionality. There is also the problem of making contact to the gate. The gates of many of the transistors in a typical integrated circuit are of the minimum gate length of that can be successfully drawn for the particular process that is being used. The contact hole may be even larger than that minimum dimension. Also there is an alignment problem. The misalignment between the gate and the contact hole is typically in the range of plus or minus 10% of the minimum gate length. Thus, if the contact is made over the active region where the transistor is formed, the contact hole will be over the source or drain as well as the gate due to misalignment. Due to etching processes, the etch for the contact hole will typically extend to the source or drain. Thus, an attempt to form a contact to gate over the active region will result in shorting the gate to the source or drain. Thus, contacts to gate are made over a field region. This extends the gate unnecessarily and increases the amount of area for transistor layout.

Another characteristic common to MOS integrated circuits is field oxide defining the active region. The field oxide is grown after the active region has been masked. The result is a field oxide which, at the active region boundary, is sloped. This field oxide at the active-region boundary has become commonly known as a bird's beak. This is an area where many defects occur due to numerous different problems. Additionally, the field oxide provides isolation between transistors in adjacent active regions. The isolation is greater for thicker field oxide but the bird's beak is an area which is quite thin. One of the solutions that has been proposed includes subsequent formation of an insulator with vertical walls inside the active region defined by conventional field oxide. This is described in an article, "A Super Self-Aligned Source/Drain MOSFET", C. K. Lau et al., *IEDM*-87, 1987 IEEE, pages 358-361. This, however, creates a large wast of space due to the oversized active region to accommodate the subsequently formed vertical-wall field oxide within the previously defined active region.

SUMMARY OF THE INVENTION

Accordingly, it is an object of the present invention to provide an improved integrated circuit device.

It is another object of the present invention to provide a method for making an improved semiconductor device. In carrying out these and other objects of the invention, there is provided, in one form, an integrated circuit device formed in a substrate, comprising an active region, a conductive strip, a first doped region, a second doped region, insulating material, and a first contact. The active region is defined by walls of a thick field. The active region comprises a stem portion having first and second ends terminating at the thick field, a first branch extending substantially orthogonally from the stem on a first side of the stem portion, and a second branch extending substantially orthogonally from the stem portion on a second side of the stem portion. The conductive strip is aligned along an intermediate portion of the stem portion and contained within the stem portion. The conductive strip terminates at the thick field at the first and second ends of the stem portion. The first doped region is in the substrate in the stem portion along the first side of the stem portion and a first side of the conductive strip. The second doped region is in the substrate in the stem portion along the second side of the stem portion and a second side of the conductive strip. The insulating material overlies the active region. The insulating material has a first hole over the conductive strip. The first metal contact is in the first hole and is in electrical contact with the conductive strip.

BRIEF DESCRIPTION OF THE DRAWINGS

FIGS. 1-13 show layout and cross-sections of an integrated circuit device at various stages in processing according to a preferred embodiment of the invention, each FIG. depicts a particular stage in the process and each FIG. is divided into A, B, and D portions in which the A portion is a layout view of the integrated circuit device, the B portion is a cross-section at a first location in the integrated circuit device, and the C portion is a cross-section at a second location in the integrated circuit device.

DETAILED DESCRIPTION OF THE INVENTION

Shown in FIG. 1A is a layout of an integrated circuit device 10 at a stage in processing. FIG. 1B and FIG. 1C are cross sections of integrated device 10 at the stage in processing of FIG. 1A taken at B—B and C—C, respectively. Device 10 is comprised of a substrate 11, a field oxide 12 which defines an active region 13, a thin oxide layer 14 overlying substrate 11 in active region 13. Active region 13 is in the present embodiment a T-shape. Active region 13 is comprised of a stem 16 running from top to bottom, a left branch 17 extending orthogonally to the left from stem 16, and a right brranch extending orthogonally to the right from stem 16. Field oxide 12 is grown to the desired thickness then etched to the desired shape of stem 16 and branches 17 and 18. Field oxide 12 is shown having vertical walls in the preferred embodiment. After field oxide 12 has been etched, thin oxide layer 14 is grown on the surface of substrate 11 in active region 16 to protect the surface from contamination during a subsequent channel-stop implant.

The channel-stop implant causes formation of a channel stop region 19 under field oxide 12 and a doped region 21 under the surface of active region 13 as shown in FIGS. 2B and 3B. Doped region 21 is below the surface of active region 13 at a depth which is about the same as the thickness of field oxide 12 which is about 5000 Angstroms. This is far below any subsequently formed source/drain. Channel stop region 19 and doped region 21 are not shown in subsequent FIGS. to improve their comprehensibility. After this channel-stop implant, oxide layer 14 is removed and a gate oxide 22 is then grown as shown in FIGS. 2B and 3B. A thin polysilicon layer 23 of about 200 Angstroms is deposited over oxide layer 22 and on the top and side of field oxide 12 as shown in FIGS. 2B and 3B. A conformal nitride layer 24 is deposited over polysilicon layer 23 as shown in FIGS. 2A, 2B, and 2C. Branches 17 and 18 are filled with nitride layer 24 to the same height as over field oxide 12 which is shown in FIG. 2B.

An anisotropic etch is then performed to obtain a sidewall spacer 26 along the walls of field oxide 12. Sidewall spacer 26 completely fills branches 17 and 18 and exposes a portion [27] of stem 16 of active region 13. The results of this etch are shown in FIGS. 3A, 3B, and 3C. After this, a combination mechanical and chemical planarization is performed which reduces the height of field oxide 12 to provide a field oxide 28 which is about 50% of the height of field oxide 12. This also reduces the height of sidewall spacer 26 by almost the same amount to provide sidewall spacer 29. The result of this planarization is shown in FIGS. 4A, 4B, and 4C. Polysilicon layer 27 is removed in the areas over field oxide 28 to leave a polysilicon layer 30 over active region 13 and on the sidewalls of field oxide 28. This planarization is achieved with an Automatic Wafer Polisher, Model No. 372, manufactured by Westech Systems, Inc., of Phoenix, Ariz.

Selected portions of sidewall spacer 29 are removed to leave a sidewall spacer portion 31 along the left wall of stem 16 from the bottom end thereof and extending to adjoin left branch 17 to the top end of stem 16 and a sidewall spacer portion 32 along the right wall of stem 16 from the bottom end thereof and also extending to the top end of stem 16. The results of this are shown in FIGS. 5A, 5B, and 5C. The removed portions of sidewall spacer 29 are portions of sidewall spacer 29 at the top and bottom of stem 16, and over branches 17 and 18. This shows a worst case alignment when the alignment tolerance is about plus or minus 10% of the minimum feature size. For example, if the distance across the exposed portion of polysilicon layer 30 in stem 16 as shown in FIG. 4C is 0.5 micron, then the distance across polysilicon layer 27 at the top and bottom of stem 16 is 0.6 micron. The mask for this etch of the top and bottom of stem 16 is nominally centered but a 10% misalignment will result in a 0.05 micron offset from center as shown in FIG. 5A. For this example of a 0.5 micron distance across the exposed portion of polysilicon layer as shown in FIG. 4C, then stem 16 is about 1.0 micron wide, and branches 17 and 18 are 0.5 micron square. These dimensions can be scaled according to the particular technology that is available. Sidewall portion 32 extends 0.1 micron into branch 18 due to the 10% misalignment. Also removed are the portions of polysilicon layer 30 and oxide layer 22 which are in branches 17 and 18 exposed by the etch of sidewall spacer 29. This leaves a polysilicon layer 33 under and between sidewall spacer portions 31 and 32 and along the sidewall of field oxide 28 in stem 16 and leaves a gate oxide 34 under and between sidewall spacer portions 31 and 32.

This leaves exposed substrate silicon in branches 17 and 18 and exposed polysilicon between sidewall spacer portions 31 and 32. A selective deposition of polysilicon is then performed so polysilicon is grown on the exposed substrate silicon to form polysilicon contact 34 in branch 17 and polysilicon contact 36 in branch 18 and on the exposed polysilicon to form polysilicon gate 37. The selective polysilicon deposition is performed sufficiently long to provide a depth which is almost as deep as field oxide 28. The result of this selective polysilicon deposition is shown in FIGS. 6A, 6B, and 6C. After forming polysilicon contacts 34 and 36 and polysilicon gate 37, nitride sidewall spacer portions 31 and 32 are removed for subsequent source/drain formation. The result of the removal of nitride sidewall spacer portions 31 and 32 is shown in FIGS. 7A, 7B, and 7C. Silicon is a good material for use in a selective deposition process. Other crystalline materials, however, may found to also be useful for this purpose. This would allow a material other than polysilicon to be used for the gate, for example.

The portions of polysilicon layer 33 which were under sidewall spacer portions 31 and 32 and along the sidewalls of field oxide 28 are removed. This a blanket etch so a mask is not required. Because it is a blanket etch, a small portion of polysilicon contacts 34 and 36 and polysilicon gate 37 is also removed. A light source/drain implant is then performed to form a source region 38 and a drain region 39. In the embodiment shown, source and drain regions 38 and 39 are N-type and substrate 11 is P-type. This N-type implant also dopes polysilicon contacts 34 and 36 and polysilicon gate 37. The result of the polysilicon layer removal and source/drain implant is shown in FIGS. 8A, 8B, and 8C. Sidewall spacers are then formed using conventional sidewall spacer formation techniques of either oxide or nitride. A sidewall spacer 41 is formed around source 38, and a sidewall spacer 42 is formed around drain 39. Sidewall spacers 41 and 42 act as masks for a heavy N-type implant which causes the formation of heavily-doped source region 43 within region 38 and a heavily-doped drain region 44 within drain region 39. This also causes polysilicon contacts 34 and 36 to be heavily-doped to N+. The sidewall spacers and heavily-doped regions are shown in FIGS. 9A, 9B, and 9C. The heavily-doped regions are thus spaced from field oxide 28 which improves source/drain to substrate voltage breakdown.

As processing continues, heavily-doped polysilicon contacts 34 and 36 begin diffusing N-type dopants into substrate 11 to form N-type region 46 under polysilicon contact 34 and N-type region 47 under polysilicon contact 36 as shown in FIGS. 10B and 10C. A further step is saliciding exposed silicon. Prior to performing the salicide step, oxide over heavily-doped source and drain regions 43 and 44 is removed. The performance of the salicide step forms a salicide layer 48 over polysilicon contact 34, a salicide layer 49 over heavily-doped drain region 43, a salicide layer over polysilicon gate 37, a salicide layer over heavily-doped region 51, and a salicide layer 52 over polysilicon contact 36. This is shown in FIGS. 10A, 10B, and 10C. An alternative use of the salicide is to further improve the electrical contact between polysilicon contacts 34 and 36 and heavily-doped regions 43 and 44 by first removing the portions of sidewall spacers 41 and 42 which adjoin polysilicon contacts 34 and 36, respectively. The salicide would attach to the sides of polysilicon contacts 34 and 36. The effect would then be to provide additional electrical contact between the raised contacts and the doped source/drain regions at the expense of another masking step.

A substantially planar insulating layer 53, such as phospho-silicate glass (PSG), is deposited over integrated circuit 10 as shown in FIGS. 11A, 11B, and 11C. A selective etch of insulating layer 53 provides holes 55, 56, and 57, as shown in FIGS. 12A, 12B, and 12C, in insulating layer 53 to expose at least portions of salicide layers 48, 50, and 52, respectively. The particular etch shown is from a mask which is nominally centered about branches 17 and 18 and stem 16 but which has a misalignment which is typical of a worst case misalignment which is about plus or minus 10% of the minimum feature size. Holes 55-57 do not extend vertically to salicide layers 49 and 51 which contact heavily-doped source and drain regions 43 and 44. Since holes 55-57 created by this etch do not extend to contact the salicide above the source/drains, the holes for the gate and source/drain can extend over source/drain without fear of a gate contact shorting to a source/drain region or a source/drain contact shorting to a gate. Hole 56, for example, is partially over salicide layer 49 but does not extend thereto. This provides for much tighter transistor formation for given contact size and alignment tolerance. In the present case, if the contact holes extended to the salicide over the source/drains, the contact size alone would cause the gate contact to short to a source/drain even with essentially no misalignment.

After formation of holes 55-57, contact to source, drain, and gate is completed by a known fill process. A relatively planar conductive material is deposited and then etched back to leave conductive material in holes 55-57. One example of this fill material is tungsten. Shown in FIGS. 13A, 13B, and 13C is tungsten fill 58, 59, and 60 in holes 55, 56, and 57, respectively. There is no mask required for obtaining tungsten fill 58-60. Aluminum contacts are then formed using a mask which is misaligned to the same degree as contact holes 55-57 are misaligned. Aluminum contacts 62, 63, and 64 are shown in FIGS. 13A, 13B, and 13C as contacting tungsten fill 58, 59, and 60, respectively. This completes metal to source/drain and gate contact. Diffusion regions 46 and 47 below polysilicon contacts 34 and 36 extend laterally, over processing, to merge with heavily-doped source and drain regions 43 and 44, and thus make good electrical contact. The source/drain contacts would still be made if this merging to heavily-doped regions 43 and 44 did not occur because there would still be merger with lightly-doped regions 38 and 39.

While the invention has been described in a specific embodiment, it will be apparent to those skilled in the art that the disclosed invention may be modified in numerous ways and may assume many embodiments other than those specifically set out and described above. For example, tungsten fill 58-60 may not be used. The combination chemical and mechanical planarization may not be required. Salicide may or may not be used, and if salicide is used, it may or may not be used to make electrical contact between the raised polysilicon contacts and the doped source/drain regions. Branches 17 and 18 may extend from other than the same end of stem 16. Accordingly, it is intended by the appended claims to cover all modifications of the invention which fall within the true spirit and scope of the invention.

I claim:

1. An integrated circuit device formed in a substrate, comprising:

an active region defined by walls of a field oxide, said active region comprising a stem portion running from a top end to a bottom end, a left branch extending left substantially orthogonally from the stem on a left side of the stem portion, and a right branch extending right substantially orthogonally from the stem portion on a right side of the stem portion;

a conductive strip aligned along an intermediate portion of the stem portion, spaced from the left side and right side of the stem portion, and contained within the stem portion, said strip terminating at the field oxide at the top and bottom ends of the stem portion;

a first doped region in the substrate in the stem portion along the left side of the stem portion and a first side of the conductive strip;

a second doped region in the substrate in the stem portion along the right side of the stem portion and a second side of the conductive strip;

a first raised conductive material overlying and contained within left branch and having a boundary partially defined by a first portion of the field oxide;

a second raised conductive material overlying and contained within the right branch;

an insulating material overlying the active region, said insulating material having a first hole over the first raised conductive material, a second hole over the second raised conductive material, and a third hole over the conductive strip;

a first contact in the first hole which makes electrical contact with the first raised conductive material;

a second contact in the second hole which makes electrical contact with the second raised conductive material; and a third contact in the third hole which makes electrical contact with the conductive strip.

2. The integrated circuit device of claim 1, further comprising contact means for making electrical contact between the first raised conductive material and the first doped region and electrical contact between the second raised conductive material and the second doped region.

3. The integrated circuit device of claim 2, wherein the contact means comprises:

a third doped region which is under the first raised conductive material and is merged with the first doped region; and a fourth doped region which is under the second raised conductive material and is merged with the second doped region.

4. An integrated circuit device formed in a substrate, comprising:

an active region defined by walls of a thick field, said active region comprising a stem portion running from a top end to a bottom end, a left branch extending left substantially orthogonally from the stem on a left side of the stem portion, and a right branch extending right substantially orthogonally from the stem portion on a right side of the stem portion;

a conductive strip aligned along an intermediate portion of the stem portion, spaced from the left side and right side of the stem portion, and contained within the stem portion, said strip terminating at the thick field at the top and bottom ends of the stem portion;

a first doped region in the substrate in the stem portion along the left side of the stem portion and a first side of the conductive strip;

a second doped region in the substrate in the stem portion along the right side of the stem portion and a second side of the conductive strip;

a first raised conductive material overlying and contained within the left branch and;

an insulating material overlying the active region, said insulating material having a first hole over the first raised conductive material; and a first metal contact in the first hole which is in electrical contact with the first raised conductive material.

5. The integrated circuit device of claim 4, wherein the insulating material is characterized as having a second hole over the conductive strip.

6. The integrated circuit device of claim 5 further comprising a second metal contact in the second hole which is in electrical contact with the conductive strip via the second hole.

7. The integrated circuit of claim 4, wherein the conductive strip is polysilicon.

8. The integrated circuit of claim 7, wherein the first raised conductive material is polysilicon.

9. An integrated circuit device formed in a substrate, comprising:

an active region defined by walls of a thick field, said active region comprising a stem portion running from a top end to a bottom end, a left branch extending left substantially orthogonally from the stem on a left side of the stem portion, and a right branch extending right substantially orthogonally from the stem portion on a right side of the stem portion;

a conductive strip aligned along an intermediate portion of the stem portion, spaced from the left side and right side of the stem portion, and contained within the stem portion, said strip terminating at the thick field at the top and bottom ends of the stem portion;

a first doped region in the substrate in the stem portion along the left side of the stem portion and a first side of the conductive strip;

a second doped region in the substrate in the stem portion along the right side of the stem portion and a second side of the conductive strip;

an insulating material overlying the active region, said insulating material having a first hole over the conductive strip; and a first metal contact in the first hole which is in electrical contact with the conductive strip.

* * * * *